United States Patent
Kim et al.

(10) Patent No.: US 7,714,763 B2
(45) Date of Patent: May 11, 2010

(54) CIRCUIT AND METHOD FOR PREVENTING BANG-BANG ERROR, CALIBRATION CIRCUIT INCLUDING THE CIRCUIT, AND ANALOG-TO-DIGITAL CONVERTER INCLUDING THE CIRCUIT

(75) Inventors: Mi-Hye Kim, Ichon-shi (KR); Seok-Bo Shim, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/130,769

(22) Filed: May 30, 2008

(65) Prior Publication Data
US 2009/0146694 A1 Jun. 11, 2009

(30) Foreign Application Priority Data
Dec. 11, 2007 (KR) .................. 10-2007-0128284

(51) Int. Cl.
*H03M 1/34* (2006.01)
(52) U.S. Cl. ........................ 341/164; 326/80
(58) Field of Classification Search ......... 341/155–170; 326/80–130
See application file for complete search history.

(56) References Cited

U.S. PATENT DOCUMENTS
7,508,332 B2 * 3/2009 Jeong et al. ................. 341/164
2007/0280330 A1 * 12/2007 Jeong et al. ................. 374/141

FOREIGN PATENT DOCUMENTS
KR      100340062 B1   5/2002
KR    1020030056903 A   7/2003
KR     102005008263 A   8/2005
KR    1020060125604 A  12/2006

OTHER PUBLICATIONS

Notice of Preliminary Rejection issued from Korean Intellectual Property Office on Apr. 27, 2009 with an English Translation.

* cited by examiner

*Primary Examiner*—Lam T Mai
(74) *Attorney, Agent, or Firm*—IP & T Law Firm PLC

(57) ABSTRACT

A circuit including a comparing unit for comparing a target voltage with a stepwise-varying tracking voltage, a counting unit for counting a code according to the comparison result of the comparing unit and a control signal generating unit for generating a signal for controlling a counting operation of the counting unit.

26 Claims, 8 Drawing Sheets

CIRCUIT AND METHOD FOR PREVENTING BANG-BANG ERROR, CALIBRATION CIRCUIT INCLUDING THE CIRCUIT, AND ANALOG-TO-DIGITAL CONVERTER INCLUDING THE CIRCUIT

CROSS-REFERENCE TO RELATED APPLICATIONS

The present invention claims priority of Korean patent application number 10-2007-0128284, filed on Dec. 11, 2007, which is incorporated by reference in its entirety.

BACKGROUND OF THE INVENTION

The present invention relates to a technique that can prevent a bang-bang error occurring in a comparator for comparing a target voltage and a stepwise-varying tracking voltage, and to a counter for counting a code according to the result of the comparison.

Before describing a bang-bang error, a calibration circuit of an on die termination (ODT) device will be described.

Semiconductor devices are implemented in integrated circuit (IC) chips such as central processing units (CPUs), memories, and gate arrays, and are incorporated into a variety of electrical products such as personal computers, servers, and workstations. Most semiconductor devices include an input circuit configured to receive signals from the outside world via input pads, and an output circuit configured to provide internal signals to the outside world via output pads.

As the operating speed of electrical products is increasing, a swing width of a signal exchanged between semiconductor devices is being gradually reduced for minimizing a delay time taken for signal transmission. However, the reduction in the swing width of the signal has a great influence on external noise, causing the signal reflectivity to be more critical at an interface terminal due to impedance mismatch. Such impedance mismatch is generally caused by external noise, a variation of a power supply voltage, a change in an operating temperature, a change in a manufacturing process, etc. The impedance mismatch may lead to difficulty in high-speed data transmission and distortion of output data. Therefore, if semiconductor devices receive the distorted output signal through an input terminal, problems such as a setup/hold failure or an error in decision of an input level may frequently arise.

In particular, in order to resolve the above problems, a memory device requiring high-speed performance employs an impedance matching circuit, which is called an ODT device, near an input pad inside an IC chip. In a typical ODT scheme, source termination is performed at a transmitting end by an output circuit, and parallel termination is performed by a termination circuit connected in parallel to a receiving circuit coupled to the input pad.

ZQ calibration refers to a procedure of generating pull-up and pull-down codes that vary with process, voltage and temperature (PVT) conditions. The resistance of the ODT device, e.g., a termination resistance at a DQ pad in a memory device, is calibrated using the codes resulting from the ZQ calibration. The ZQ calibration is so-named because the calibration is performed using a ZQ node that is a node for calibration.

The ZQ calibration in the ODT device will be described below.

FIG. 1 is a block diagram of a calibration circuit for performing ZQ calibration in a conventional ODT device. Throughout the drawings, VDDQ indicates drain voltage and VSSQ indicates source voltage.

Referring to FIG. 1, the conventional ODT device for performing ZQ calibration includes a pull-up calibration resistor circuit 110, a dummy calibration resistor circuit 120, a pull-down calibration resistor circuit 130, a reference voltage generator 102, comparators 102 and 103, and counters 105 and 106. The pull-up calibration resistor circuit 110 includes a plurality of pull-up resistors which are turned on/off in response to a pull-up calibration code PCODE<0:N>. The dummy calibration resistor circuit 120 is implemented with the same structure as the pull-up calibration resistor circuit 110. The pull-down calibration resistor circuit 130 includes a plurality of pull-down resistors which are turned on/off in response to a pull-down calibration code NCODE<0:N>.

The pull-up calibration resistor circuit 110 generates the primary calibration code PCODE<0:N> while it is calibrated with an external resistor 101 connected to a ZQ node. The dummy calibration resistor circuit 120 and the pull-down calibration resistor circuit 130 generate the secondary calibration code NCODE<0:N> using the calibration code PCODE<0:N> which has been generated through the pull-up calibration resistor circuit 110.

Upon operation of the ODT device, the comparator 103 compares a ZQ node voltage with a reference voltage VREF (generally, VDDQ/2) generated from the reference voltage generator 102 and generates up/down signals (UP/DOWN). Herein, the ZQ node voltage is generated by coupling the pull-up calibration resistor circuit 110 to the external resistor 101 (generally, 240Ω) connected to the ZQ pin that is disposed outside the chip of the ZQ node.

The pull-up counter 105 receives the up/down signals to generate the pull-up calibration code PCODE<0:N> represented with a binary code, which turns on/off the resistors connected in parallel in the pull-up calibration resistor circuit 110, thereby calibrating a total resistance of the pull-up calibration resistor circuit 110. The calibrated resistance of the pull-up calibration resistor circuit 110 affects the ZQ node voltage again and the above-described calibration procedure is then repeated. That is, the pull-up calibration resistor circuit 110 is calibrated such that the total resistance of the pull-up calibration resistor circuit 110 is equal to the resistance of the external resistor 101, which is called a pull-up calibration.

The binary code, i.e., the pull-up calibration code PCODE<0:N>, generated during the pull-up calibration is input to the dummy calibration resistor circuit 120 and determines a total resistance of the dummy calibration circuit 120. Consequently, the dummy calibration resistor circuit will have the same resistance as the pull-up calibration resistor circuit. Thereafter, a pull-down calibration is performed in a similar manner to the pull-up calibration. Specifically, a voltage of a node A is made equal to the reference voltage VREF by using the comparator 104 and the pull-down counter 106. That is, the pull-down calibration is performed to make a total resistance of the pull-down calibration resistor circuit 130 equal to a total resistance of the dummy calibration resistor circuit 120.

The binary codes PCODE<0:N> and NCODE<0:N> resulting from the ZQ calibration, i.e., the pull-up and pull-down calibrations, are input to pull-up and pull-down resistors (termination resistors) at input/output pads, which are designed to have the same structure as the pull-up and pull-down calibration resistor circuits in the calibration circuit of FIG. 1, and determine the resistance of the ODT device. In a memory device, resistances of pull-up and pull-down resistors at a DQ pad are determined.

FIG. 2 is a circuit diagram illustrating how termination resistance of an output driver in a semiconductor memory device is determined using the calibration codes PCODE<0:N> and NCODE<0:N> generated from the calibration circuit of FIG. 1.

The output driver for outputting data in the semiconductor memory device includes pre-drivers 210 and 220 provided in up/down circuits, and pull-up and pull-down termination resistor circuits 230 and 240 for outputting data.

Upon operation of the output driver, the pre-drivers 210 and 220 control the pull-up termination resistor circuit 230 and the pull-down resistor circuit 240, respectively. When outputting high-level data, the pull-up termination resistor circuit 230 is turned on so that a data pin DQ goes to a high state. On the other hand, when outputting low-level data, the pull-down termination resistor circuit 240 is turned on so that the data pin DQ goes to a low state. That is, the data pin DQ is pull-up or pull-down terminated to output the high-level data or low-level data.

At this time, the number of resistors in the pull-up and pull-down termination resistor circuits 230 and 240 to be turned on is determined by the pull-up and pull-down calibration codes PCODE<0:N> and NCODE<0:N>. Specifically, whether to turn on the pull-up termination resistor circuit 230 or the pull-down termination resistor circuit 240 is determined by the logic level of the output data, but the turning on and off of the respective resistors in the turned-on termination resistor circuits 230 and 240 is respectively determined by the pull-up calibration code PCODE<0:N> and the pull-down calibration code NCODE<0:N>.

For reference, target resistances of the pull-up and pull-down resistor circuits 230 and 240 are not necessarily equal to resistances (240Ω) of the calibration resistor circuits (110, 120 and 130 in FIG. 1) but may have a resistance of one-half (120Ω) or one-quarter (60Ω) of 240Ω, etc. In FIG. 2, reference symbols DQp_CTRL and DQn_CTRL input to the pre-drivers 210 and 220 denote a set of various control signals.

FIG. 3 illustrates a procedure of equalizing the ZQ node voltage to the reference voltage through the calibration operation of FIG. 1.

Bang-bang error occurring in the generation of the pull-up calibration code PCODE<0:N> is shown in FIG. 3. The bang-bang error is a phenomenon that the ZQ node voltage keeps fluctuating above and below the reference voltage VREF at regular steps during the calibration operation because the ZQ node voltage is not accurately equal to the reference voltage VREF.

FIG. 4 is a circuit diagram illustrating another conventional calibration circuit in which the comparator of FIG. 1 is improved so as to remove the bang-bang error shown in FIG. 3.

While the calibration circuit of FIG. 1 employs the two comparators 103 and 104, the calibration circuit of FIG. 4 employs four comparators 403_1, 403_2, 404_1 and 404_2, and hold logics 407 and 408 added to up/down circuits respectively.

As for a basic pull-up operation, the comparator 403_1 compares the ZQ node voltage with a reference voltage VREF+A, and the comparator 403_2 compares the ZQ node voltage with a reference voltage VREF-A. The case where outputs of the comparators 403_1 and 403_2 differ from each other means that the ZQ node voltage is in the range of VREF-A to VREF+A. In this case, the hold logic 407 generates a hold signal P_HOLD to disable an operation of a counter 405 and hold the pull-up calibration code PCODE<0:N>. When the hold signal P_HOLD is not activated, the counting operation of the counter 405 is performed using one output P_CNT of the two outputs of the comparators 403_1 and 403_2. Likewise, a pull-down operation is performed in the same manner as the pull-up operation, employing signals N_CNT and N_HOLD.

FIG. 5 is a circuit diagram of the hold logics 407 and 408 in the calibration circuit of FIG. 4.

The two hold logics 407 and 408 may be implemented with the same structure. In FIG. 5, reference symbols OUT_A and OUT_B denote the outputs of the two comparators 403_1 and 403_2 or 404_1 and 404_2. When the outputs OUT_A and OUT_B of the comparators have different logic levels, the hold signal HOLD is activated to a high level and thus the counting operation of the counter 405 or 406 is performed using the counting signal CNT having the same logic level as the output OUT_A of the comparator.

FIG. 6 illustrates a procedure of equalizing the ZQ node voltage to the reference voltage through the calibration operation described with reference to FIG. 4. In FIG. 6, it can be observed that the ZQ node voltage is locked to a predetermined level once the ZQ node voltage falls within a target range.

As described above, the comparators more than the originally required comparators are used for preventing the bang-bang error, and the reference voltages more than the originally required reference voltages are used. Since the comparator is implemented with a differential amplifier or the like, it occupies a large area. Further, an area is significantly increased in implementation of logics for regenerating the reference voltages.

In other words, although the related art can prevent the bang-bang error, it leads to a considerable increase in the entire area of the circuit.

SUMMARY OF THE INVENTION

Embodiments of the present invention are directed to providing a hold circuit, and to a method for preventing a bang-band error through a simple circuit occupying a small area, to a calibration circuit including the hold circuit, and to an analog-to-digital converter including the hold circuit.

In accordance with an aspect of the invention, there is provided a circuit that includes a comparing unit for comparing a target voltage with a stepwise-varying tracking voltage, a counting unit for counting a code according to the comparison result of the comparing unit and a control signal generating unit for generating a signal for controlling a counting operation of the counting unit. In accordance with an aspect of the invention, there is provided a calibration circuit of an on die termination (ODT) device that includes a first comparator configured to compare a level of a reference voltage with a level of a calibration node connected to an external resistor, a first hold logic configured to compare a past comparison value of the first comparator with a current comparison value, and activate a first hold signal when the past comparison value is different from the current comparison value, a first counter configured to count a pull-up calibration code determining a pull-up termination resistance according to a comparison value of the first comparator, and stop counting the pull-up calibration code when the first hold signal is activated, and a pull-up calibration resistor unit configured to pull up the calibration node by turning on/off internal parallel resistors in response to the pull-up calibration code. In accordance with another aspect of the invention, there is provided an analog-to-digital converter that includes a comparator unit configured to compare a conversion target voltage with a tracking voltage, a hold logic configured to activate a hold signal when a past comparison value is different from a current comparison value, a counter unit configured to count a digital code according to the comparison value of the comparator unit and stop counting the digital code when the hold signal is activated and a converter unit configured to generate the tracking voltage in response to the digital code. In accordance with an aspect of the invention, there is provided a method for preventing a bang-bang error occurring in a comparator for comparing a target voltage with a stepwise-varying tracking voltage and a counter for counting a code according to the comparison result of the comparator, the method includes a step of periodically storing a comparison value of the comparator and a step of activating a hold signal for stopping a counting operation of the counter when a stored comparison value of a past period is different from a current comparison value output from the comparator. In accordance with an aspect of the invention, there is provided a method for preventing a bang-bang error occurring in a comparator for comparing a target voltage with a stepwise-varying tracking voltage and a counter for counting a code according to the comparison result of the comparator, the method includes a step of delaying a comparison value of the comparator and a step of activating a hold signal for stopping a counting operation of the counter when a delayed comparison value of a past period is different from a current comparison value output from the comparator.

DESCRIPTION OF SPECIFIC EMBODIMENTS

Hereinafter, a hold circuit and method for preventing a bang-band error, a calibration circuit including the hold circuit, and an analog-to-digital converter including the hold circuit in accordance with the present invention will be described in detail with reference to the accompanying drawings.

Figure 7:
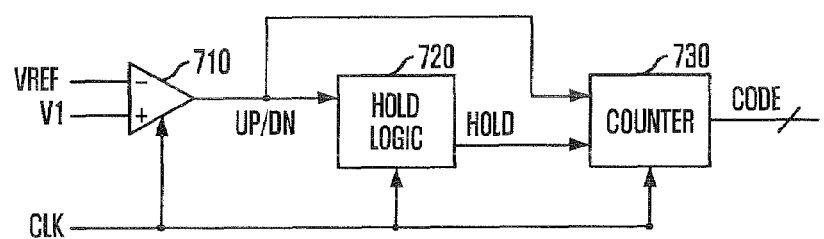
FIG. 7 is a block diagram of a hold circuit for removing a bang-bang error occurring between a comparator and a counter in accordance with an embodiment of the present invention.

FIG. 7 is a block diagram of a hold circuit for removing a bang-bang error occurring between a comparator and a counter in accordance with an embodiment of the invention.

Figure 1:
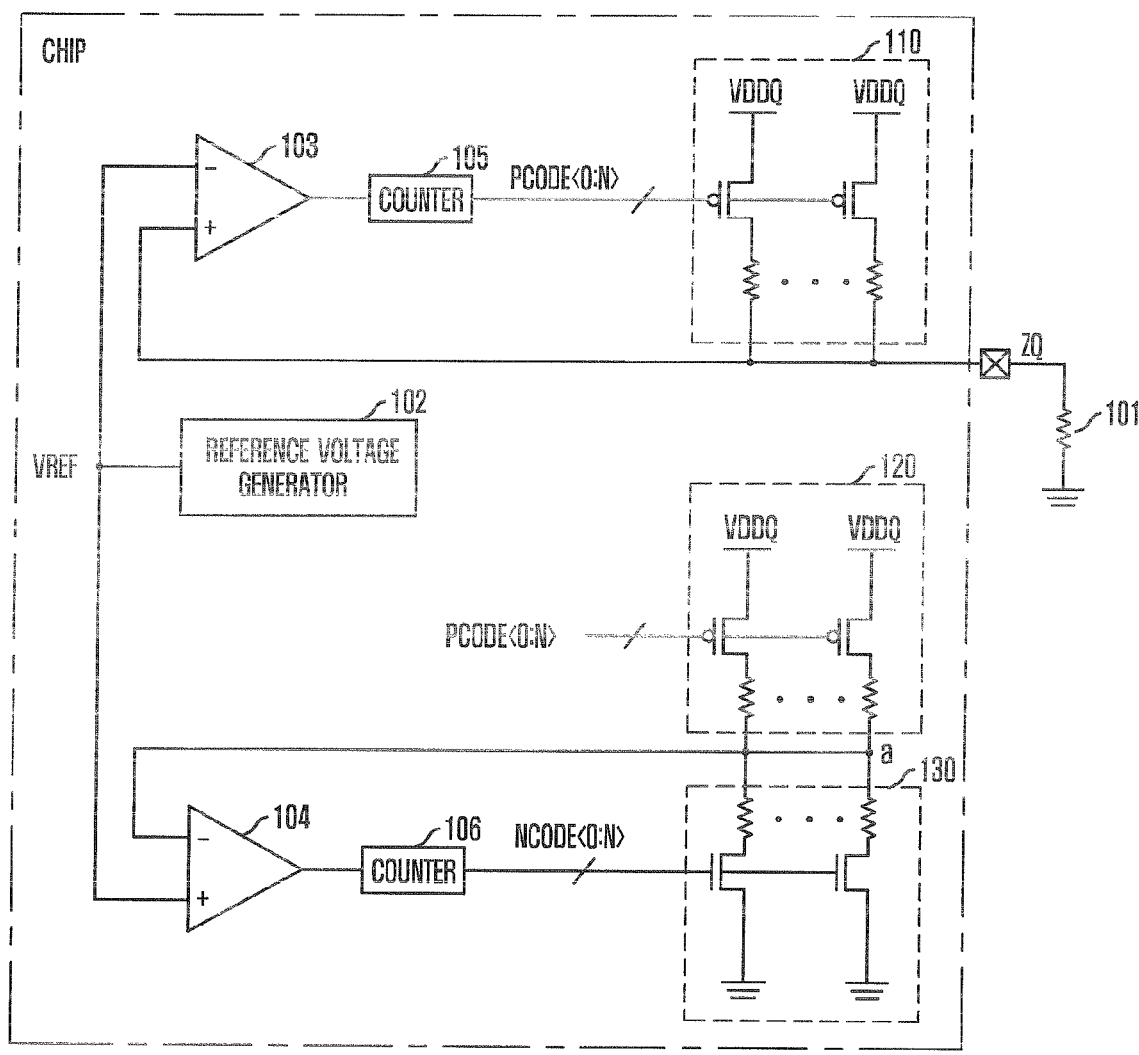
FIG. 1 is a block diagram of a calibration circuit for performing ZQ calibration in a conventional ODT device.
Figure 2:
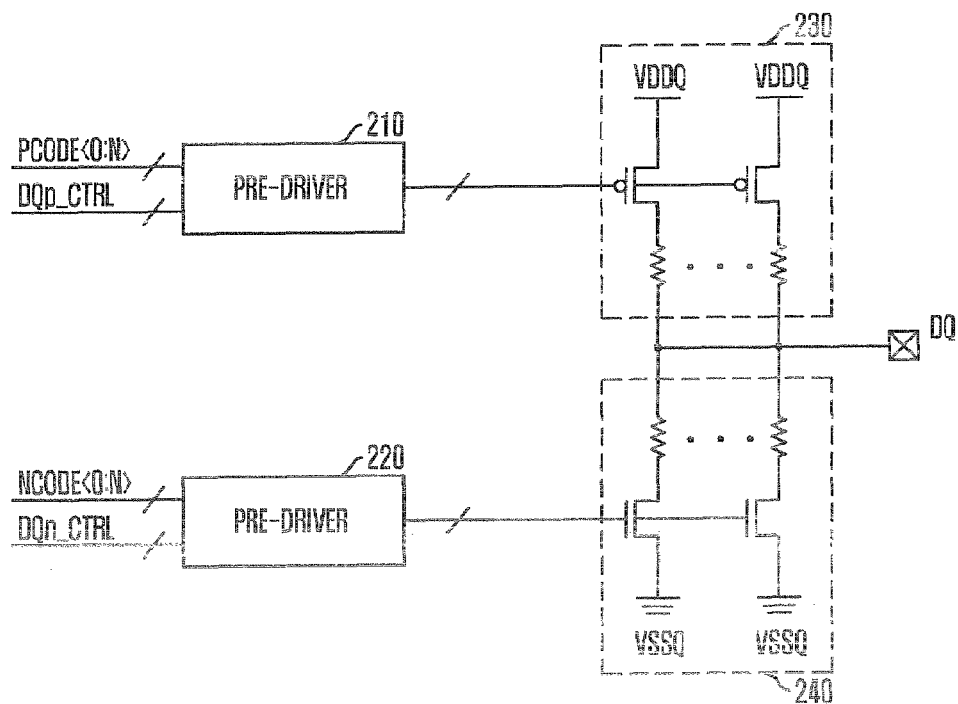
FIG. 2 is a circuit diagram illustrating how termination resistance of an output driver in a semiconductor memory device is determined using the calibration codes PCODE<0:N> and NCODE<0:N> generated from the calibration circuit of FIG. 1.
Figure 3:
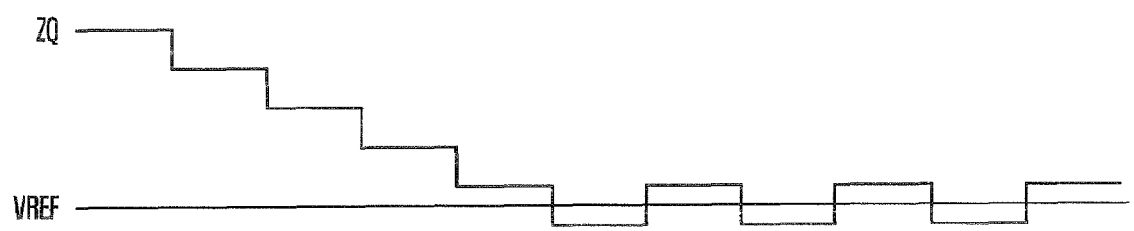
FIG. 3 illustrates a procedure of equalizing the ZQ node voltage to the reference voltage through the calibration operation of FIG. 1.

Referring to FIG. 7, a comparator 710 compares a target voltage VREF with a stepwise-varying tracking voltage V1 and outputs a comparison value UP/DN. The stepwise-varying tracking voltage corresponds to the ZQ of FIG. 1. The target voltage VREF refers to a voltage that corresponds to the reference voltage VREF that the tracking voltage V1 should reach in the calibration circuit of FIG. 1. When the tracking voltage V1 is not a continuously-varying voltage but a stepwise-varying voltage, it cannot exactly reach the target voltage VREF. Thus, even though the tracking voltage V1 is sufficiently close to the target voltage VREF, that is, it cannot be closer to the target voltage VREF any more, a bang-bang error occurs so that the output value of the comparator 710 keeps changing from high to low or vice versa.

A clock CLK input to the comparator 710 is a clock that enables the comparison operation of the comparator 710. For example, only when the clock CLK is at a high level, the comparator 710 compares the target voltage VREF with the tracking voltage V1 and updates the comparison result value UP/DN. It is optional to determine whether to operate the comparator 710 only when the clock CLK is enabled, or to always operate the comparator 710 without receiving the clock CLK.

The hold circuit 720 in accordance with the embodiment of the invention compares a past comparison value UP/DN with a current comparison value UP/DN of the comparator 710 and activates a hold signal HOLD to stop a counting operation of a counter 730 when the two comparison values UP/DN are different from each other. That the previous comparison value UP/DN and the current comparison value UP/DN of the comparator 710 are different from each other means that the tracking voltage V1 becomes lower than the target voltage VREF or becomes higher than the target voltage VREF. That is, the moment that the level of the comparison value UP/DN changes is the moment that the tracking voltage V1 is closest to the target voltage VREF. At this time, when the operation of the counter 730 is stopped, the most adequate result value can be obtained without bang-bang error. A power-up signal PWRUPB input to the hold circuit 720 is used to settle an initial value of the hold signal HOLD. The hold circuit 720 will be described later in more detail with reference to FIGS. 8 and 9.

The counter 730 counts a code CODE according to the comparison value UP/DN output from the comparator 710. The counter 730 stops counting the code CODE when the hold signal HOLD is activated. More specifically, upon counting of the clock CLK, when the comparison value UP/DN is at a high level, the counter 730 increases the code CODE by one whenever the clock CLK of a high level is input. When the comparison value UP/DN is at a low level, the counter 730 decreases the code CODE by one whenever the clock CLK of a low level is input. The code CODE output from the counter 730 changes the level of the tracking voltage V1. How the code CODE influences the level of the tracking voltage V1 may be different according to circuits to which the invention is to be applied. However, since the level of the tracking voltage V1 is changed according to the digital code CODE that has been applied to any circuits, the level of the tracking voltage V1 is always changed stepwise. This causes the bang-bang error in which the tracking voltage V1 keeps fluctuating above and below the target voltage VREF.

Figure 8:
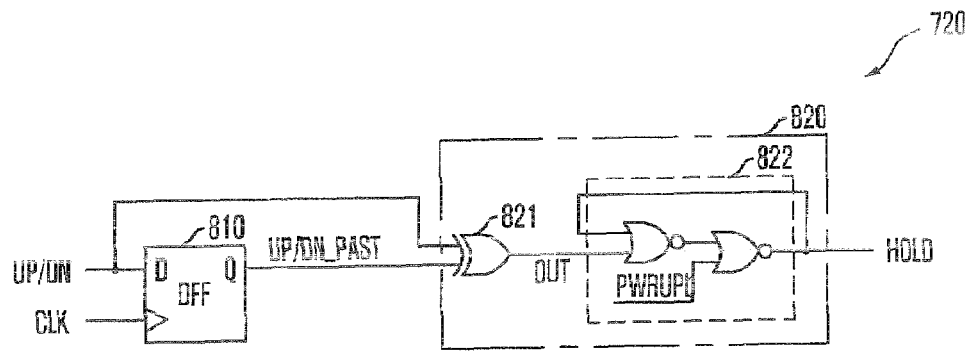
FIG. 8 is a circuit diagram of a hold circuit (720) of FIG. 7 in accordance with an embodiment of the invention.

FIG. 8 is a circuit diagram of the hold circuit 720 of FIG. 7 in accordance with an embodiment of the invention.

Referring to FIG. 8, the hold circuit 720 includes a storage unit 810 for periodically storing the comparison value UP/DN output from the comparator 710, and a control unit 820 for activating the hold signal HOLD when the comparison value UP/DN_PAST of a past period, which is stored in the storage unit 810, is different from a current comparison value UP/DN output from the comparator 710.

The storage unit 810 stores the comparison value UP/DN output from the comparator 710 in synchronization with the clock CLK. The storage unit 810 may be implemented with a D flip-flop 810 having a clock terminal receiving the clock CLK and a D terminal receiving the comparison value UP/DN. As is well known, the D flip-flop 810 latches a value input through the D terminal at a rising edge of the clock CLK, and outputs the same value until a next rising edge of the clock CLK.

The control unit 820 activates the hold signal HOLD when the comparison value UP/DN_PAST of the past period, which is stored in the storage unit 810, is different from the current comparison value UP/DN. As illustrated in FIG. 8, the control unit 820 may include an exclusive-OR gate 821 for activating the hold signal HOLD by logically combining the output value UP/DN_PAST of the D flip-flop 810 with the current comparison value UP/DN output from the comparator 710. The hold signal HOLD is activated in response to an output signal OUT of the exclusive-OR gate 821.

The hold signal HOLD is activated when the exclusive-OR gate 821 activates the signal OUT that is a basis of the hold signal HOLD. The activated hold signal HOLD is continuously maintained in the activated state by a latch 822. If the counter 730 stops counting the code CODE in response to the activated hold signal HOLD, the level of the tracking voltage V1 is not changed any more. Therefore, the output signal OUT of the exclusive-OR gate 821 is activated in a form of a pulse signal. Hence, the latch 822 is used for continuously stopping the counting operation of the counter 730 by maintaining the activated state of the hold signal HOLD. The power-up signal PWRUPb input to the latch 822 (which is the same as PWRUPB) is maintained at a high level and then changed to a low level when the circuit begins to operate. The power-up signal PWRUPb is used for maintaining an initial value of the hold signal HOLD at a low level.

The latch 822 may be removed if the counter 730 is designed to stop the counting operation when the pulse signal like the output signal OUT of the exclusive-OR gate 821 is activated. Since such a design modification can be easily achieved by those skilled in the art, detailed description thereof will be omitted.

Figure 9:
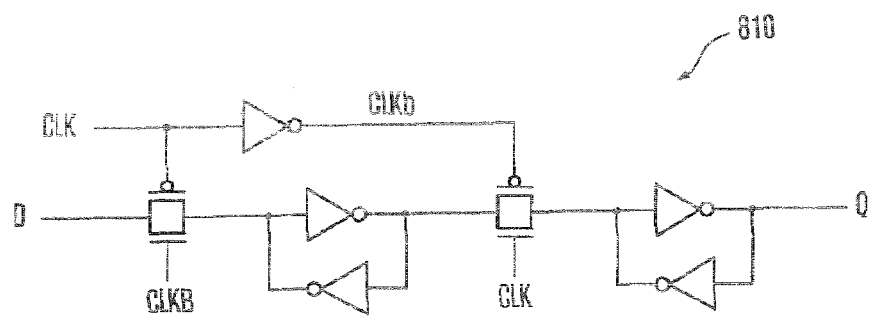
FIG. 9 is a circuit diagram of the D flip-flop (810) of FIG. 8.

FIG. 9 is a circuit diagram of the D flip-flop 810 of FIG. 8.

Since the D flip-flop 810 of FIG. 9 is a general D flip-flop that is well known to those skilled in the art, detailed description thereof will be omitted. In the drawing, D is the D-input, Q is the output, and the clock signals are CLK, CLKB and CLKb.

It is apparent that the D flip-flop 810 can be designed by a combination of various logic gates.

Figure 10:
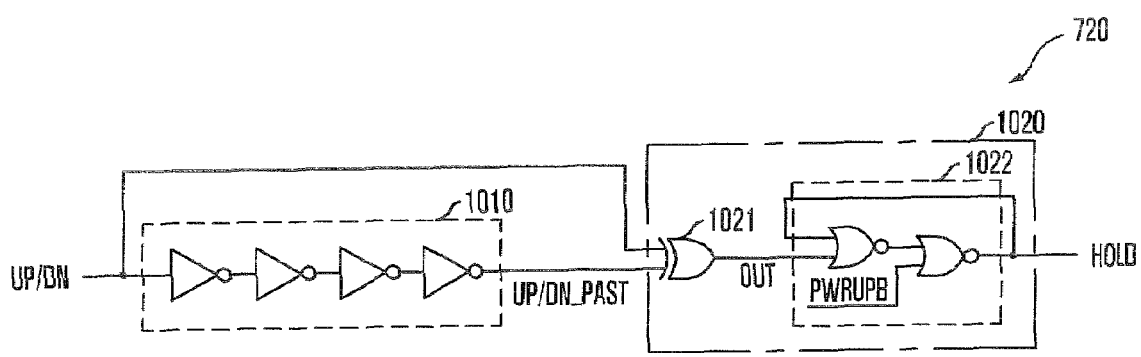
FIG. 10 is a circuit diagram of the hold circuit (720) of FIG. 7 in accordance with another embodiment of the invention.

FIG. 10 is a circuit diagram of the hold circuit 720 of FIG. 7 in accordance with another embodiment of the invention.

Referring to FIG. 10, the hold circuit 720 includes a delay unit 1010 and a control unit 1020. The delay unit 1010 delays the comparison value UP/DN of the comparator 710, and the control unit 1020 activates the hold signal HOLD when the comparison value UP/DN_PAST output from the delay unit 1010 is different from the current comparison value UP/DN output from the comparator 710.

The delay unit 1010 delays the comparison value UP/DN output from the comparator 710. Therefore, the output signal of the delay unit 1010 becomes the comparison value UP/DN-_PAST of the past period, that is, the previous time. The delay unit 1010 may be implemented a plurality of inverters as illustrated in FIG. 10, or may be implemented with various well-known delay circuits.

The control unit 1020 activates the hold signal HOLD when the past comparison value UP/DN_PAST output from the delay unit 1010 is different from the current comparison value UP/DN output from the comparator 710. Since the control unit 1020 of FIG. 10 has the same structure as the control unit 820 of FIG. 8, further description thereof will be omitted.

Figure 11:
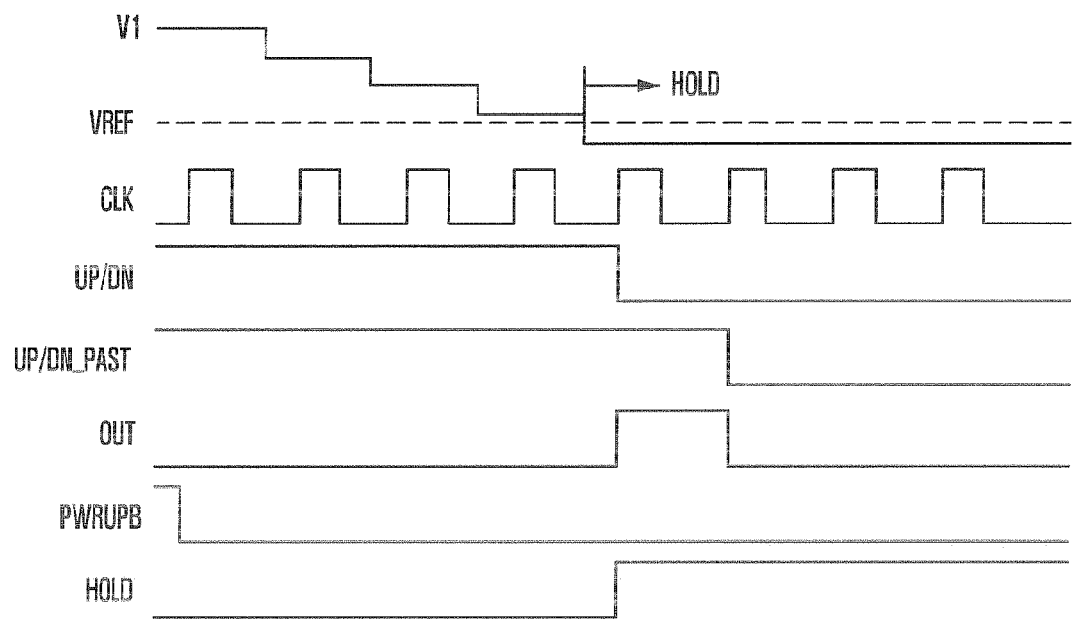
FIGS. 11 and 12 are timing diagrams illustrating the operation of the hold circuit (720) described with reference to FIGS. 7 to 10.
Figure 12:
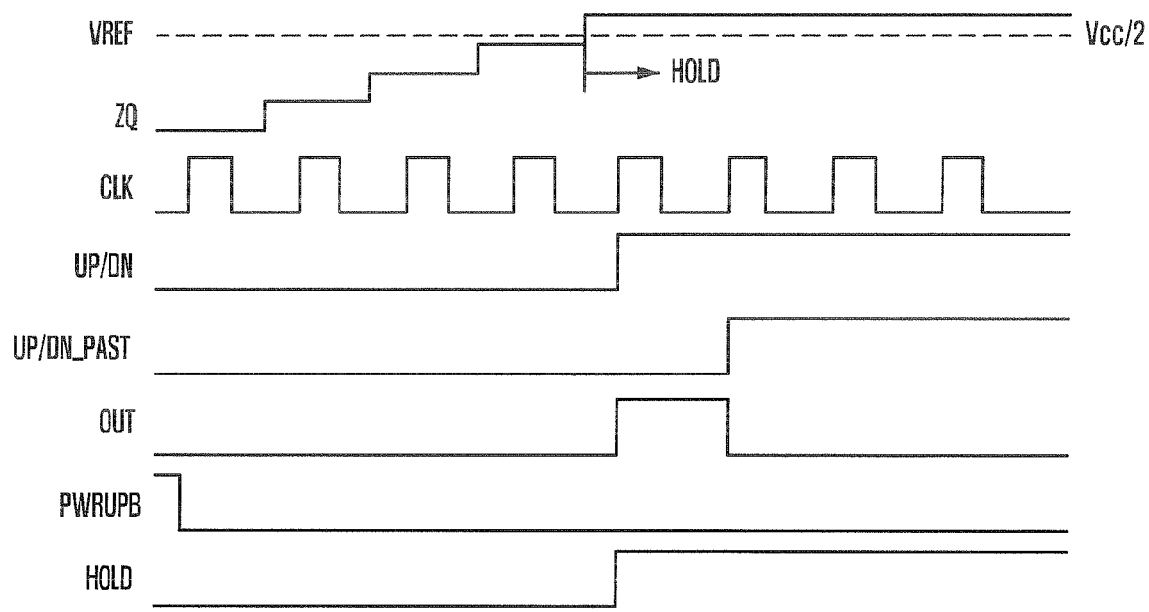

FIGS. 11 and 12 are timing diagrams illustrating the operation of the hold circuit 720 described with reference to FIGS. 7 to 10.

A case where the tracking voltage V1 is decreased to be lower than the target voltage VREF is illustrated in FIG. 11. Referring to FIG. 11, the current comparison value UP/DN output from the comparator 710 changes from high to low, and the output signal OUT of the exclusive-OR gate 821 is activated while the past comparison value UP/DN_PAST is still maintained at a high level. Therefore, it can be seen that the hold signal HOLD is activated. The counting operation of the counter 730 is stopped by the hold signal HOLD, and the level of the tracking voltage V1 is held. Consequently, the bang-bang error does not occur. That is, the tracking voltage V1 does not fluctuate above and below the target voltage VREF.

A case where the tracking voltage V1 is increased to be higher than the target voltage VREF is illustrated in FIG. 12. Referring to FIG. 12, the current comparison value UP/DN output from the comparator 710 changes from low to high, and the output signal OUT of the exclusive-OR gate 821 is activated while the past comparison value UP/DN_PAST is still maintained at a low level. Therefore, it can be seen that the hold signal HOLD is activated. The counting operation of the counter 730 is stopped by the hold signal HOLD, and the level of the tracking voltage V1 is held. Consequently, the bang-bang error does not occur. That is, the tracking voltage V1 does not fluctuate above and below the target voltage VREF.

Figure 13:
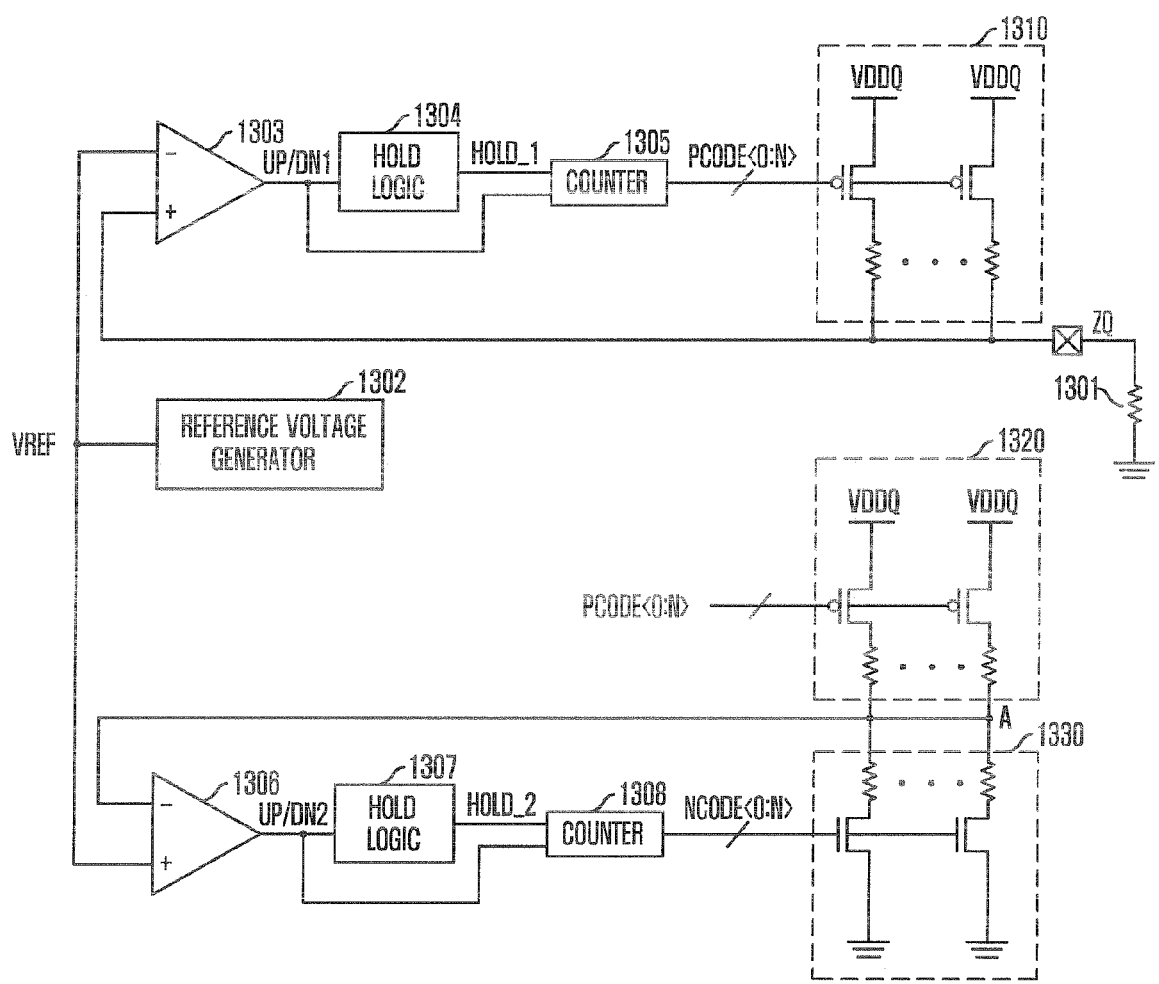
FIG. 13 is a circuit diagram of a calibration circuit of an ODT device having a hold circuit in accordance with an embodiment of the invention.

FIG. 13 is a circuit diagram of a calibration circuit of an ODT device having a hold circuit in accordance with an embodiment of the invention.

Referring to FIG. 13, the calibration circuit of the ODT device includes a first comparator unit 1303, a first hold logic 1304, a first counter unit 1305, and a pull-up calibration resistor unit 1310. The first comparator unit 1303 compares a level of a reference voltage VREF with a level of a calibration node ZQ connected to an external resistor 1301. The first hold logic 1304 activates a first hold signal HOLD_1 when a past comparison value UP/DN1_PAST is different from a current comparison value UP/DN1 of the first comparator 1303. The past comparison value UP/DN1_PAST is generated inside the hold logic. The first counter unit 1305 counts a pull-up calibration code PCODE<0:N> according to the comparison value UP/DN1 of the first comparator unit 1303, and stops the counting operation when the first hold signal HOLD_1 is activated. The pull-up calibration code PCODE<0:N> is a code for determining a pull-up termination resistance. The pull-up calibration resistor unit 1310 pulls up the calibration node ZQ by turning on/off internal parallel resistors in response to the pull-up calibration code PCODE<0:N>. Through the above configuration, the calibration circuit generates a pull-up calibration code PCODE<0:N>.

In order to generate a pull-down calibration code NCODE<0:N>, the calibration circuit further includes a dummy calibration resistor unit 1320, a second comparator unit 1306, a second hold logic 1307, a second counter unit 1308, and a pull-down calibration resistor unit 1330. The dummy calibration resistor unit 1320 pulls up a node A by turning on/off internal parallel resistors in response to the pull-up calibration code PCODE<0:N>. The second comparator unit 1306 compares a level of the node A with the level of the reference voltage VREF. The second hold logic 1307 activates a second hold signal HOLD2 when the past comparison value UP/DN2_PAST is different from a current comparison value UP/DN2 of the second comparator unit 1306. The past comparison value UP/DN2_PAST is generated inside the hold logic. The second counter unit 1308 counts a pull-down calibration code NCODE<0:N> according to the comparison value UP/DN2 of the second comparator 1306, and stops the counting operation when the second hold signal HOLD_2 is activated. The pull-down calibration code NCODE<0:N> is a code for determining a pull-down termination resistance. The pull-down calibration resistor unit 1330 pulls down the node A by turning on/off internal parallel resistors in response to the pull-down calibration code PCODE<0:N>.

In the calibration circuit, the voltage of the calibration node ZQ and the voltage of the node A reach the reference voltage VREF while they are changed stepwise. Therefore, the voltages of the calibration node ZQ and the node A correspond to the tracking voltage V1 of FIG. 7, and the reference voltage VREF of FIG. 13 corresponds to the target voltage VREF of FIG. 7.

The first hold logic 1304 and the second hold logic 1307 have the same structure as the hold circuit described with reference to FIGS. 7 to 12. The bang-bang error of the calibration circuit can be removed by applying the first hold logic 1304 and the second hold logic 1307 to the conventional calibration circuit of FIG. 1.

Figure 4:
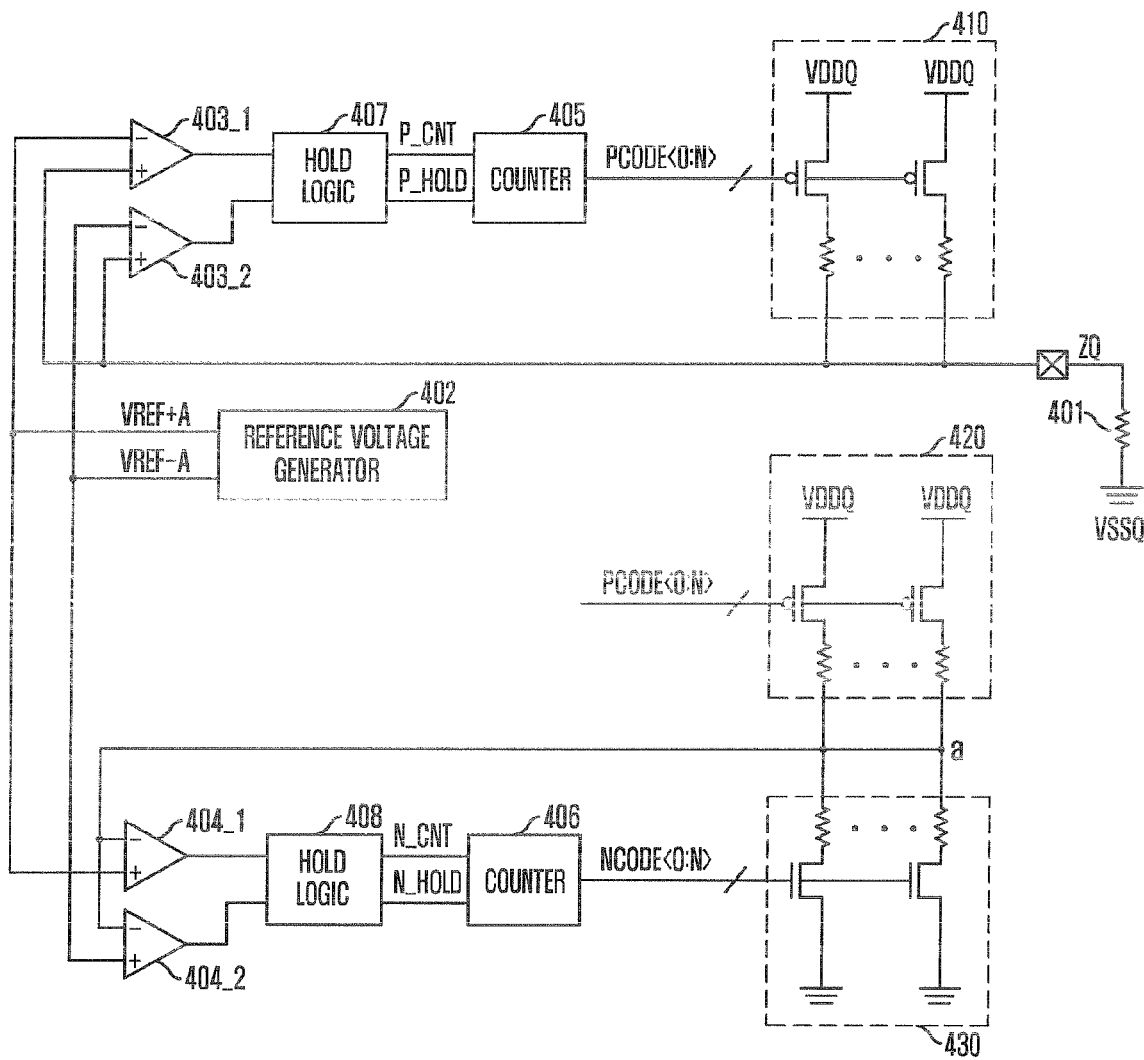
FIG. 4 is a circuit diagram illustrating another conventional calibration circuit in which the comparator of FIG. 1 is improved so as to remove the bang-bang error shown in FIG. 3.
Figure 5:
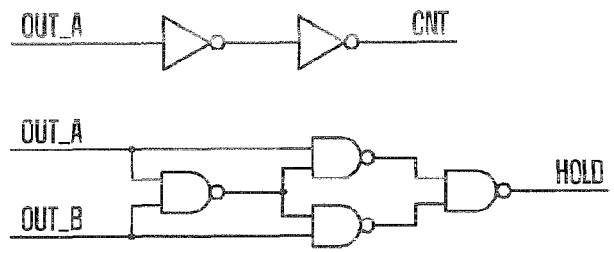
FIG. 5 is a circuit diagram of hold logics (407, 408) in the calibration circuit of FIG. 4.
Figure 6:
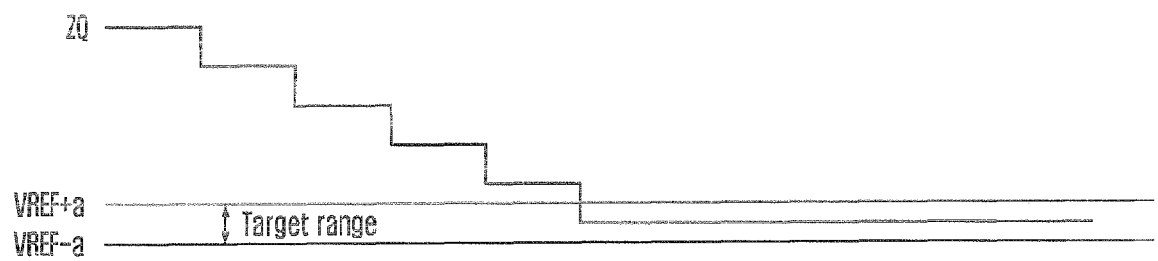
FIG. 6 illustrates a procedure of equalizing the ZQ node voltage to the reference voltage through the calibration operation described with reference to FIG. 4.

An entire circuit area of the calibration circuit of FIG. 13 is significantly reduced compared with the conventional calibration circuit of FIG. 4 having the bang-bang removing function. Since the comparator and the reference voltage generator (two reference voltages are needed in the calibration circuit of FIG. 4) occupy a large area, the removal of these circuits means that a circuit area is greatly reduced.

The calibration circuit may generate only the pull-up calibration code PCODE<0:N> in order for the pull-up termination at the input/output node, or may generate both the pull-up calibration code PCODE<0:N> and the pull-down calibration code NCODE<0:N>. The case of generating only the pull-up calibration code PCODE<0:N> is achieved through the components 1301, 1304, 1305 and 1310, and the case of generating both the pull-up calibration code PCODE<0:N> and the pull-down calibration code NCODE<0:N> is achieved through all the components 1301 to 1330.

In FIG. 13, the first hold logic 1304 and the second hold logic 1307 are used to remove both the bang-bang error occurring in generating the pull-up calibration code PCODE<0:N> and the bang-bang error occurring in generating the pull-down calibration code NCODE<0:N>. Of the two hold logics, only the first hold logic 1304 may be used if the calibration circuit intends to remove only the bang-bang error occurring in generating the pull-up calibration code PCODE<0:N>, and only the second hold logic 1307 may be used if the calibration circuit intends to remove only the bang-band error occurring in generating the pull-down calibration code NCODE<0:N>.

The first hold logic 1304 and the second hold logic 1307 have the same structure as the hold circuit 720 described with reference to FIGS. 7 to 12. Since the operations of the other components of the calibration circuit have been described in detail in the "BACKGROUND OF THE INVENTION" section, further description thereof will be omitted.

Figure 14:
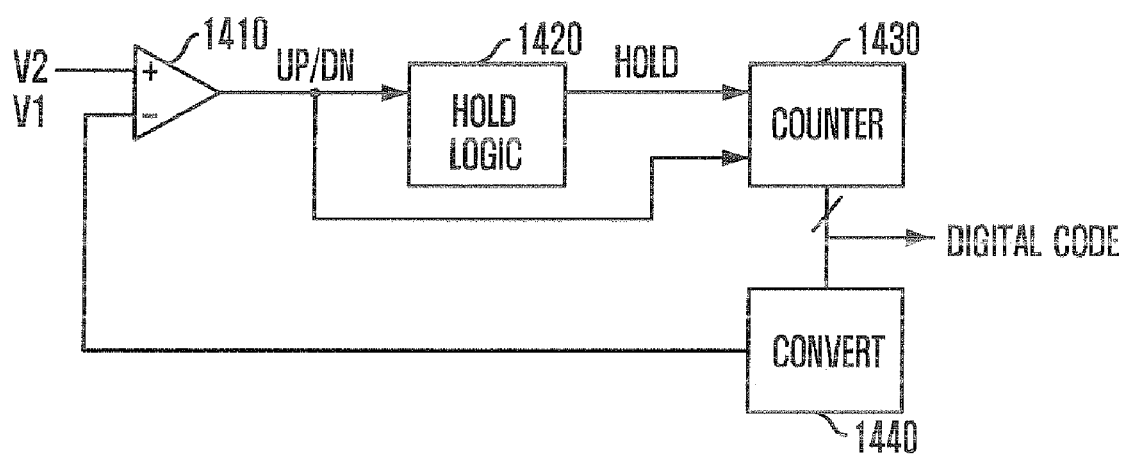
FIG. 14 is a block diagram of an analog-to-digital converter (ADC) having a hold circuit in accordance with an embodiment of the invention.

FIG. 14 is a block diagram of an analog-to-digital converter (ADC) having a hold circuit in accordance with an embodiment of the invention.

Referring to FIG. 14, the ADC includes a comparator unit 1410, a hold logic 1420, a counter unit 1430, and a converter unit 1440. The comparator unit 1410 compares a conversion target voltage V2 with a tracking voltage V1. The hold logic 1420 activates a hold signal HOLD when a past comparison value UP/DN_PAST is different from a current comparison value UP/DN. The past comparison value UP/DN_PAST is generated inside the hold logic through delay and storage. The counter unit 1430 counts a digital code according to the comparison value UP/DN, and stops the counting operation when the hold signal HOLD is activated. The converter unit 1440 generates the tracking voltage V1 in response to the digital code.

The ADC of FIG. 14 converts the analog voltage V2 into the digital code while increasing or decreasing the digital code until the tracking voltage V1 has the same level as the conversion target voltage V2. Such an ADC is referred to as a tracking ADC. The tracking ADC generally includes the comparator unit 1410, the counter unit 1430, and the converter unit 1440. The ADC of FIG. 4 is implemented by applying the hold logic 1420 to the conventional tracking ADC.

Since the tracking voltage V1 output from the converter unit 1440 is a stepwise-varying voltage, it is difficult to make the tracking voltage V1 completely equal to the conversion target voltage V2. For this reason, the bang-bang error occurs between the comparator unit 1410 and the counter unit 1430. Thus, the hold logic 1420 for preventing the bang-bang-error is needed.

The hold logic 1420 has the same structure as the hold logic described with reference to FIGS. 7 to 12. The conversion target voltage V2 of FIG. 14 corresponds to the target voltage VREF of FIG. 7, and the tracking voltage V1 of FIG. 14 corresponds to the tracking voltage V1 of FIG. 7.

An operation of the ADC for converting the conversion target voltage V2 into the digital code will be described below.

The converter unit 1440 is a digital-to-analog converter (DAC) that converts the digital code from the counter unit 1430 into the tracking voltage V1.

The comparator unit 1410 compares the tracking voltage V1 with the conversion target voltage V2. The comparator unit 1410 outputs the comparison value DN for enabling the counter unit 1430 to decrease the digital code when the level of the conversion target voltage V2 is lower than the level of the tracking voltage V1, and outputs the comparison value UP for enabling the counter unit 1430 to increase the digital code when the level of the conversion target voltage V2 is higher than the level of the tracking voltage V1.

In addition, the counter 1430 decreases or increases the preset digital code in response to the comparison value UP/DN.

In summary, the ADC compares the conversion target voltage V2 with the tracking voltage V1 and makes the tracking voltage V1 track the conversion target voltage V1 by repetitively increasing or decreasing the digital code. The digital code obtained when the tracking is completed becomes a digital value of the conversion target voltage V2. The tracking voltage V1 is a stepwise-varying voltage because the discontinuous digital code is converted into the analog value, and thus the bang-bang error occurs between the comparator unit 1410 and the counter unit 1430. The hold logic 1420 prevents the occurrence of the bang-bang error.

A method for preventing a bang-bang error in accordance with an embodiment of the invention will be described below with reference to FIGS. 7 to 12.

A method for removing a bang-bang error using the embodiment of FIG. 8 will be first described below. This method removes a bang-bang error occurring in the comparator 710 for comparing the target voltage VREF with the stepwise-varying tracking voltage V1 and the counter 730 for counting the code CODE according to the comparison result UP/DN of the comparator 710. This method includes periodically storing the comparison value UP/DN of the comparator 710, and activating the hold signal HOLD for stopping the counting operation of the counter 730 when the comparison value UP/DN_PAST of the past period is different from the current comparison value UP/DN output from the comparator 710.

Next, a method for removing a bang-bang error using the embodiment of FIG. 10 will be described below. This method removes a bang-bang error occurring in the comparator 710 for comparing the target voltage VREF with the stepwise-varying tracking voltage V1 and the counter 730 for counting the code CODE according to the comparison result UP/DN of the comparator 710. This method includes delaying the comparison value UP/DN of the comparator 710, and activating the hold signal HOLD for stopping the counting operation of the counter 730 when the delayed comparison value UP/DN_PAST of the past period is different from the current comparison value UP/DN output from the comparator 710.

In addition, the two methods may further include maintaining the activated state of the hold signal HOLD, like the latches 822 of FIGS. 8 and 10.

In accordance with the embodiments of the invention, the bang-bang error is prevented by stopping the counting operation of the counter when the past comparison value is different from the current comparison value. Hence, the bang-bang error can be prevented without increasing the number of the comparators and the number of the reference voltages.

Therefore, the bang-bang error can be prevented using a circuit occupying a very small area compared with the related art.

While the invention has been described with respect to the specific embodiments, it will be apparent to those skilled in the art that various changes and modifications may be made without departing from the spirit and scope of the invention as defined in the following claims.

What is claimed is:

1. A circuit, comprising:
   a comparing unit configured to compare a target voltage with a stepwise-varying tracking voltage;
   a counting unit configured to perform a counting operation according to a comparison value of the comparing unit; and
   a control signal generating unit configured to generate a control signal for controlling a counting operation of the counting unit,
   wherein the counting operation is stopped by the control signal when a current comparison value of the comparing unit is different from a previous comparison value of the comparing unit.

2. The circuit as recited in claim 1, wherein the control signal generating unit includes:
   a storage unit configured to periodically store the comparison value of the comparing unit; and
   a control unit configured to activate the control signal when the previous comparison value, which is stored in the storage unit, is different from the current comparison value output from the comparing unit.

3. The circuit as recited in claim 1, wherein the control signal generating unit includes:
   a delay unit configured to delay the comparison value of the comparing unit and output the previous comparison value; and
   a control unit configured to activate the control signal when the previous comparison value output from the delay unit is different from the current comparison value output from the comparing unit.

4. The circuit as recited in claim 2, wherein the storage unit stores the comparison value output from the comparing unit in synchronization with a clock.

5. The circuit as recited in claim 2, wherein the control unit continuously maintains the activated state of the control signal.

6. The circuit as recited in claim 2, wherein the storage unit includes a D flip-flop to store the comparison value output from the comparing unit in synchronization with a clock.

7. The circuit as recited in claim 6, wherein the control unit includes an exclusive-OR gate to activate the control signal by logically combining an output value of the D flip-flop with the comparison value output from the comparing unit.

8. The circuit as recited in claim 3, wherein the delay unit includes a plurality of inverters connected in series.

9. The circuit as recited in claim 3, wherein the control unit includes an exclusive-OR gate to activate the control signal by logically combining the output value of the delay unit with the comparison value output from the comparing unit.

10. A calibration circuit of an on die termination (ODT) device, comprising:
    a first comparator configured to compare a level of a reference voltage with a voltage level of a calibration node connected to an external resistor;
    a first hold logic configured to compare a past comparison value of the first comparator with a current comparison value thereof, and to activate a first hold signal when the past comparison value differs from the current comparison value;
    a first counter configured to count a pull-up calibration code determining a pull-up termination resistance according to a comparison value of the first comparator, and stop counting the pull-up calibration code when the first hold signal is activated; and
    a pull-up calibration resistor unit configured to pull up the calibration node by turning on/off internal parallel resistors in response to the pull-up calibration code.

11. The calibration circuit as recited in claim 10, further comprising:
    a dummy calibration resistor unit configured to pull up a voltage on a node (A) by turning on/off internal parallel resistors in response to the pull-up calibration code;
    a second comparator configured to compare a voltage level of the node (A) with the level of the reference voltage;
    a second hold logic configured to compare a past comparison value of the second comparator with a current comparison value, and activate a second hold signal when the past comparison value differs from the current comparison value;

a second counter configured to count a pull-down calibration code determining a pull-down termination resistance according to a comparison value of the second comparator, and stop counting the pull-down calibration code when the second hold signal is activated; and a pull-down calibration resistor unit configured to pull down the voltage on the node (A) by turning on/off internal parallel resistors in response to the pull-down calibration code.

12. The calibration circuit as recited in claim 10, wherein the first hold logic includes a storage unit configured periodically to store the comparison value of the first comparator, and a control unit configured to activate the first hold signal when the comparison value of a past period, which is stored in the storage unit, differs from the current comparison value output from the first comparator.

13. The calibration circuit as recited in claim 10, wherein the first hold logic includes a delay unit configured to delay the comparison value of the first comparator, and a control unit configured to activate the first hold signal when the comparison value output from the delay unit differs from the current comparison value output from the first comparator.

14. The calibration circuit as recited in claim 12, wherein the control unit continuously maintains the activated state of the first hold signal.

15. The calibration circuit as recited in claim 12, wherein the storage unit includes a D flip-flop configured to store the comparison value output from the first comparator in synchronization with a clock, and wherein the control unit includes an exclusive-OR gate configured to activate the first hold signal by logically combining an output value of the D flip-flop with the current comparison value output from the first comparator.

16. An analog-to-digital converter, comprising:
a comparator unit configured to compare a conversion target voltage with a tracking voltage to obtain a comparison value;
a hold logic configured to activate a hold signal when a past comparison value obtained by the comparator unit is different from a current comparison value obtained by the comparator unit;
a counter unit configured to count a digital code according to the comparison value obtained by the comparator unit, and to stop counting the digital code when the hold signal is activated; and
a converter unit configured to generate the tracking voltage in response to the digital code.

17. The analog-to-digital converter as recited in claim 16, wherein the hold logic includes a storage unit configured periodically to store the comparison value obtained by the comparator unit, and a control unit configured to activate the hold signal when a comparison value of a past period, which is stored in the storage unit, differs from the current comparison value output from the comparator unit.

18. The analog-to-digital converter as recited in claim 17, wherein the control unit continuously maintains the activated state of the hold signal.

19. The analog-to-digital converter as recited in claim 16, wherein the hold logic includes a delay unit configured to delay the comparison value of the comparator unit and a control unit configured to activate the hold signal when the comparison value output from the delay unit differs from the current comparison value output from the comparator unit.

20. The analog-to-digital converter as recited in claim 19, wherein the control unit continuously maintains the activated state of the hold signal.

21. The analog-to-digital converter as recited in claim 17, wherein the storage unit includes a D flip-flop configured to store the comparison value output from the comparator unit in synchronization with a clock, and the control unit includes an exclusive-OR gate configured to activate the hold signal by logically combining an output value of the D flip-flop with the current comparison value output from the comparator unit.

22. The analog-to-digital converter as recited in claim 19, wherein the delay unit includes a plurality of inverters connected in series, and the control unit includes an exclusive-OR gate configured to activate the hold signal by logically combining the output value of the delay unit with the current comparison value output from the comparator unit.

23. A method for preventing a bang-bang error occurring in a comparator configured to compare a target voltage with a stepwise-varying tracking voltage and a counter configured to perform a counting operation according to a comparison value of the comparator, the method comprising periodically storing the comparison value of the comparator to output a previous comparison value, and activating a hold signal for stopping the counting operation when the previous comparison value is different from a current comparison value output from the comparator.

24. A method for preventing a bang-bang error occurring in a comparator configured to compare a target voltage with a stepwise-varying tracking voltage and a counter configured to perform a counting operation according to a comparison value of the comparator, the method comprising delaying a comparison value of the comparator to output a previous comparison value, and activating a hold signal for stopping the counting operation of the counter when the previous comparison value differs from a current comparison value output from the comparator.

25. The method as recited in claim 23, further comprising continuously maintaining the activated state of the hold signal.

26. The method as recited in claim 24, further comprising continuously maintaining the activated state of the hold signal.

* * * * *

UNITED STATES PATENT AND TRADEMARK OFFICE
CERTIFICATE OF CORRECTION

PATENT NO.        : 7,714,763 B2                                    Page 1 of 1
APPLICATION NO.   : 12/130769
DATED             : May 11, 2010
INVENTOR(S)       : Kim et al.

It is certified that error appears in the above-identified patent and that said Letters Patent is hereby corrected as shown below:

On the Title Page Change foreign patent documents as follows:

Item [56] Foreign Patent Documents
  KR 1020050082636 A    8/2005

Signed and Sealed this

Twenty-ninth Day of June, 2010

David J. Kappos
*Director of the United States Patent and Trademark Office*